US012772375B2

(12) United States Patent
Lee et al.

(10) Patent No.: US 12,772,375 B2
(45) Date of Patent: Oct. 20, 2026

(54) PRINTED CIRCUIT BOARD

(71) Applicant: SAMSUNG ELECTRO-MECHANICS CO., LTD., Suwon-si (KR)

(72) Inventors: Jin Uk Lee, Suwon-si (KR); Chi Hyeon Jeong, Suwon-si (KR); Youn Gyu Han, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 224 days.

(21) Appl. No.: 18/640,207

(22) Filed: Apr. 19, 2024

(65) Prior Publication Data

US 2025/0016917 A1 Jan. 9, 2025

(30) Foreign Application Priority Data

Jul. 3, 2023 (KR) ........................ 10-2023-0085811

(51) Int. Cl.
*H05K 1/00* (2006.01)
*H05K 1/02* (2006.01)
*H05K 1/11* (2006.01)

(52) U.S. Cl.
CPC ........... *H05K 1/0298* (2013.01); *H05K 1/115* (2013.01); *H05K 2201/09327* (2013.01); *H05K 2201/09518* (2013.01); *H05K 2201/09536* (2013.01)

(58) Field of Classification Search
CPC ................. H05K 1/0298; H05K 1/115; H05K 2201/09327; H05K 2201/09518; H05K 2201/09536
See application file for complete search history.

(56) References Cited

U.S. PATENT DOCUMENTS

2009/0158581 A1 6/2009 Nguyen et al.
2012/0139668 A1 6/2012 Mina et al.
2024/0237203 A1* 7/2024 Shimizu ............... H05K 1/0298

FOREIGN PATENT DOCUMENTS

JP 2014192497 A * 10/2014
JP 2021111710 A * 8/2021 ............. H05K 3/108

* cited by examiner

*Primary Examiner* — Pete T Lee
(74) *Attorney, Agent, or Firm* — MORGAN, LEWIS & BOCKIUS LLP

(57) ABSTRACT

The present disclosure relates to a printed circuit board including: an insulating layer; and a plurality of wiring layers disposed in the insulating layer, wherein the plurality of wiring layers include a first wiring layer, a second wiring layer disposed on the first wiring layer, and a third wiring layer disposed on the second wiring layer, the second wiring layer is thicker than each of the first and third wiring layers, and the second wiring layer includes one or microcircuit patterns and has an aspect ratio, which is a ratio of a height to a line width, being 2.4 to 3.6.

18 Claims, 6 Drawing Sheets

100A

PRINTED CIRCUIT BOARD

CROSS-REFERENCE TO RELATED APPLICATION(S)

This application claims the benefit of priority to Korean Patent Application No. 10-2023-0085811, filed on Jul. 3, 2023 in the Korean Intellectual Property Office, the disclosure of which is incorporated herein by reference in its entirety.

TECHNICAL FIELD

The present disclosure relates to a printed circuit board.

BACKGROUND

As the market has recently changed from an existing portable device-oriented business to high-capacity servers, amounts of data are rapidly increasing and servers, networks, and storage are increasing more rapidly. Accordingly, high-layer new structural substrates including a microcircuit are expanding. For example, Fan-out multi-chip module (FOMCM), Fan-out Embedded Bridge (FOEB), and Embedded Multi-die Interconnect Bridge (EMIB) are being developed.

SUMMARY

An aspect of the present disclosure is to provide a printed circuit board that may secure excellent signal characteristics without substantially increasing a thickness of an entire layer.

One of various solutions proposed through the present disclosure is to reduce signal loss by increasing a thickness of a wiring layer including a microcircuit, for example, by increasing an aspect ratio of the microcircuit to a certain level, and to control an entire thickness at the same time.

For example, according to an aspect of the present disclosure, a printed circuit board may include: an insulating layer; and a plurality of wiring layers disposed in the insulating layer, in which the plurality of wiring layers may include a first wiring layer, a second wiring layer disposed on the first wiring layer, and a third wiring layer disposed on the second wiring layer, the second wiring layer may be thicker than each of the first and third wiring layers, and the second wiring layer may include one or microcircuit patterns and have an aspect ratio, which is a ratio of a height to a line width, being 2.4 to 3.6.

Another of various solutions proposed through the present disclosure is to reduce signal loss by increasing a thickness of a wiring layer including a microcircuit to a certain level compared to an insulating distance from the wiring layer other than the microcircuit, and to control an entire thickness at the same time.

For example, according to an aspect of the present disclosure, a printed circuit board may include: an insulating layer; and a plurality of wiring layers disposed in the insulating layer, in which the plurality of wiring layers may include a first wiring layer, a second wiring layer disposed on the first wiring layer, and a third wiring layer disposed on the second wiring layer, the second wiring layer may be thicker than each of the first and third wiring layers, a thickness of the second wiring layer may be greater than each of an insulating distance between the first and second wiring layers and an insulating distance between the second and third wiring layers, and when the thickness of the second wiring layer is defined as t2, the insulating distance between the first and second wiring layers is defined as d1, and the insulating distance between the second and third wiring layers is defined as d2, t2, d1 and d2 may satisfy $(1.4*d1) \leq t2 \leq (2.6*d1)$ and $(1.4*d2) \leq t2 \leq (2.6*d2)$.

One of the effects of the present disclosure is to provide a printed circuit board that may secure excellent signal characteristics without substantially increasing a thickness of an entire layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
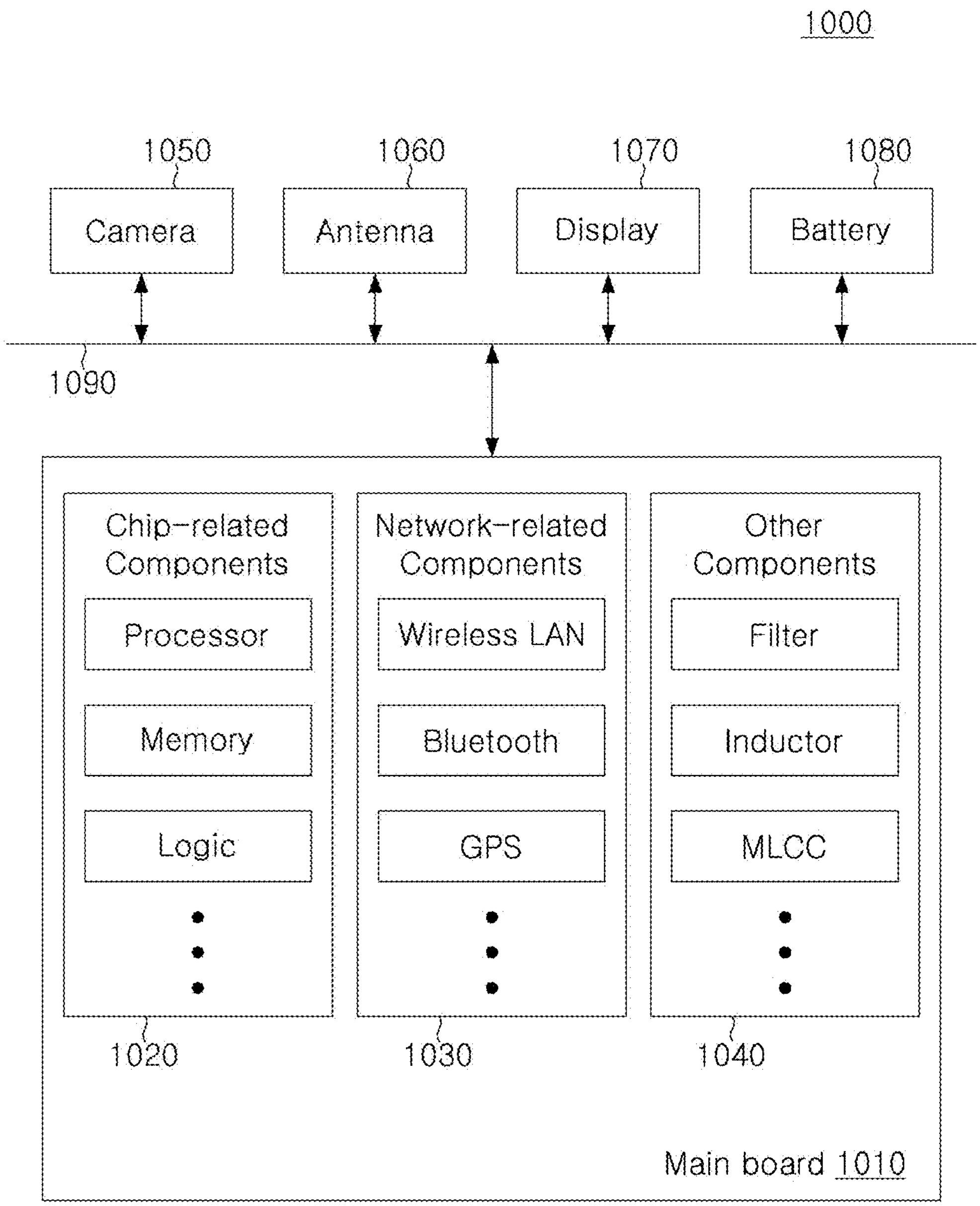
FIG. 1 is a block diagram schematically illustrating an example of an electronic device system.

Hereinafter, the present disclosure will be described with reference to the accompanying drawings. In the drawings, the shape and size of the elements may be exaggerated or reduced for clearer description.

Electronic Device

FIG. 1 is a block diagram schematically illustrating an example of an electronic device system.

Referring to FIG. 1, an electronic device 1000 accommodates a main board 1010 therein. Chip-related components 1020, network-related components 1030, and other components 1040, and the like, are physically and/or electrically connected to the main board 1010. These components are also coupled to other electronic components to be described below to form various signal lines 1090.

The chip-related components 1020 may include a memory chip such as a volatile memory (e.g., a DRAM), a non-volatile memory (e.g., a ROM), a flash memory, or the like; an application processor chip such as a central processor (e.g., a CPU), a graphics processor (e.g., a GPU), a digital signal processor, a cryptographic processor, a microprocessor, a microcontroller, or the like; and a logic chip such as an analog-to-digital (ADC) converter, an application-specific IC (ASIC), or the like. However, the chip-related components 1020 are not limited thereto, and may also include other types of chip-related electronic components. Furthermore, the chip-related components 1020 may be coupled to each other. The chip-related component 1020 may have the form of a package including the above-described chip or electronic component.

The network-related components 1030 may include wireless fidelity (Wi-Fi) (such as IEEE 802.11 family), worldwide interoperability for microwave access (WiMAX) (such as IEEE 802.16 family), IEEE 802.20, long term evolution (LTE), evolution data only (Ev-DO), HSPA+, HSDPA+, HSUPA+, EDGE, GSM, GPS, GPRS, CDMA, TDMA, DECT, Bluetooth, 3G, 4G, and 5G protocols, and any other wireless and wired standards or protocols specified thereafter. However, the network-related components 1030 are not limited thereto, and may also include any of a number of other wireless or wired standards or protocols. Furthermore, the network-related components 1030 may be coupled to the chip-related components 1020.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), or the like. However, other components are not limited thereto, and may also include passive components in the form of chip components used for various other purposes. In addition, other components 1040 may be coupled to each other, together with the chip-related components 1020 and/or the network-related components 1030.

Depending on a type of electronic device 1000, the electronic device 1000 may include other electronic components that may or may not be physically and/or electrically connected to main board 1010. These other electronic components may include, for example, a camera module 1050, an antenna module 1060, a display 1070, and a battery 1080. However, these other electronic components are not limited thereto, but may also include an audio codec, a video codec, a power amplifier, a compass, an accelerometer, a gyroscope, a speaker, a mass storage device (e.g., a hard disk drive), a compact disk (CD), a digital versatile disk (DVD), or the like. In addition thereto, other electronic components used for various purposes depending on a type of electronic device 1000 may be included.

The electronic device 1000 may be a smartphone, a personal digital assistant, a digital video camera, a digital still camera, a network system, a computer, a monitor, a tablet PC, a laptop PC, a netbook PC, a television, a video game machine, a smartwatch, an automotive component. However, the electronic device 1000 is not limited thereto, and may be any other electronic device that processes data in addition thereto.

Figure 2:
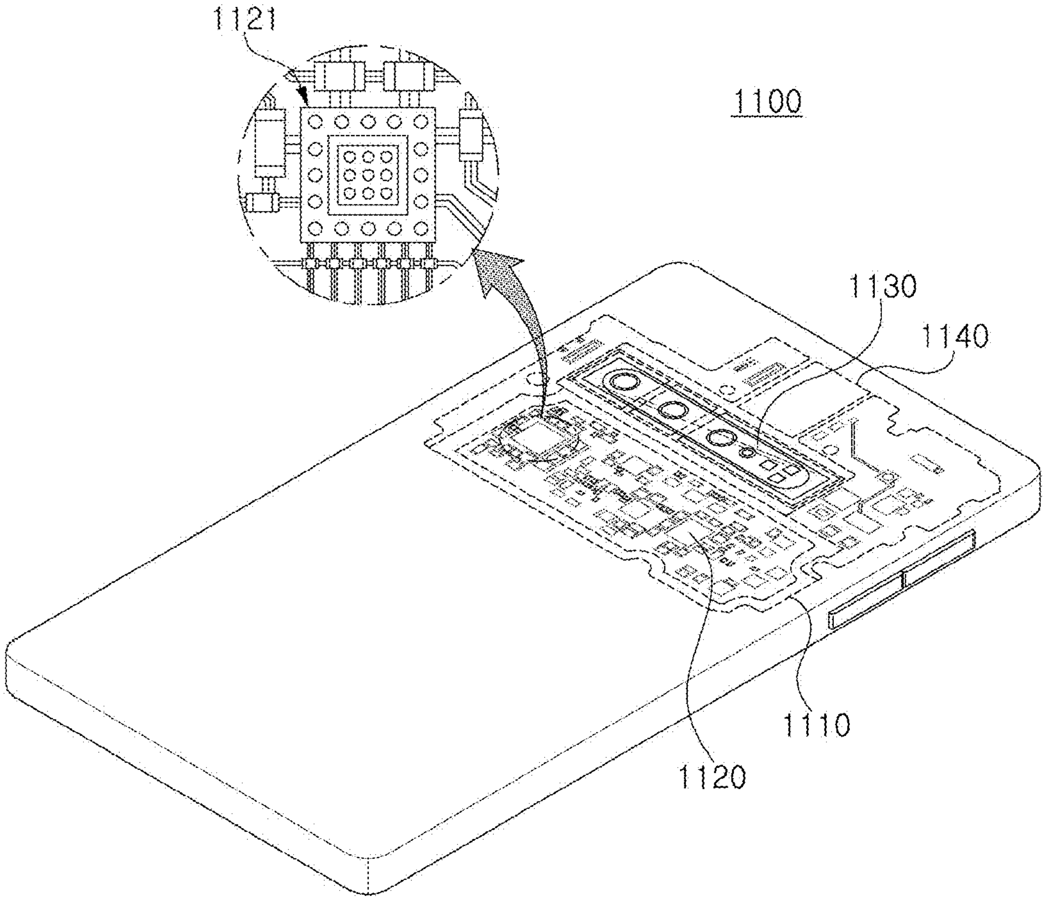
FIG. 2 is a perspective view schematically illustrating an example of an electronic device.

FIG. 2 is a perspective view schematically illustrating an example of an electronic device.

Referring to FIG. 2, an electronic device may be, for example, a smartphone 1100. A mother board 1110 may be accommodated in the smartphone 1100, and various components 1120 may be physically and/or electrically connected to the mother board 1110. Furthermore, other components that may or may not be physically and/or electrically connected to the mother board 1110, such as a camera module 1130 and/or a speaker 1140, may be accommodated in the smartphone 1100. Some of the components 1120 may be the chip-related components described above, for example, the component package 1121, but the present disclosure is not limited thereto. The component package 1121 may have the form of a printed circuit board in which an electronic component including an active component and/or a passive component is mounted on a surface. Alternatively, the component package 1121 may have the form of a printed circuit board in which an active component and/or a passive component are embedded. On the other hand, the electronic device is not necessarily limited to the smartphone 1100, and may be other electronic devices as described above.

Printed Circuit Board

Figure 3:
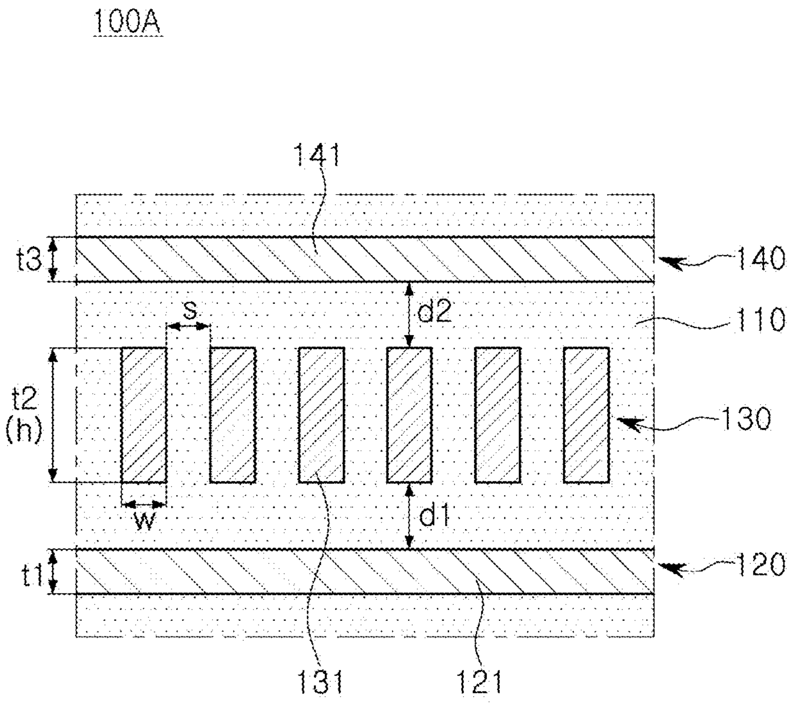
FIG. 3 is a schematic cross-sectional view of an example of a printed circuit board.

FIG. 3 is a schematic cross-sectional view of an example of a printed circuit board.

Referring to FIG. 3, a printed circuit board 100A according to an example embodiment includes an insulating layer 110 and a plurality of wiring layers 120, 130 and 140 disposed in the insulating layer 110. The plurality of wiring layers 120, 130 and 140 include a first wiring layer 120, a second wiring layer 130 disposed on the first wiring layer 120, and a third wiring layer 140 disposed on the second wiring layer 130. The second wiring layer 130 may include a microcircuit pattern 131, for example, a signal pattern 131, and each of the first and third wiring layers 120 and 140 may include ground patterns 121 and 141.

Meanwhile, the second wiring layer 130 may include one or more microcircuit patterns 131 and have an aspect ratio, which is a ratio of a height to a line width, being 2.4 to 3.6. For example, the microcircuit pattern 131 may have a line width (w) of substantially 1 μm, an interval (s) between the patterns of substantially 1 μm, a height (h) of substantially 3 μm, but the present disclosure is not limited thereto. In this case, signal loss may be reduced by increasing a cross-sectional area while maintaining the signal pattern as the microcircuit pattern, thereby improving signal characteristics. When the aspect ratio of the microcircuit pattern 131 is less than 2.4, this may not be enough to reduce signal loss, and when the aspect ratio thereof is greater than 3.6, a yield may be lowered due to process defects or the like, and a thickness of the microcircuit layer may be excessively thick, which may make it difficult to control an entire thickness.

For example, as shown in Table 1 below, it may be seen that in Inventive Examples 3 to 7 in which the aspect ratio of the microcircuit pattern 131 was 2.4 or more, the signal loss was low, approximately less than −0.10 db, but in Inventive Examples 1 and 2 in which the aspect ratio was less than 2.4, the signal loss was significant, approximately −0.10 db or more. Furthermore, in the case of Inventive Examples 1 to 6 in which the aspect ratio was 3.6 or less, an expected yield was excellent to about 0.70 to 0.90, but in the case of Inventive Example 7 in which the aspect ratio exceeded 3.6, the expected yield was deteriorated to about 0.30. Meanwhile, the line width, the interval, and the height of the pattern were measured using a scanning microscope, an electron microscope, and/or an optical microscope based on a polished or cut-out section of the printed circuit board. When the line width, the interval, and the height of the pattern were not constant, the corresponding value was measured using an average value of values measured at any of five points. Furthermore, copper (Cu) was used as a material for the pattern.

TABLE 1

| Division | Line Width (w) | Interval (s) | Thickness (t) | Aspect ratio (AR) | Characteristic impedance (Z0) | Signal Loss [@3.2 Ghz] | Expected yield (Y) |
|---|---|---|---|---|---|---|---|
| 1 | 1.0 μm | 1.0 μm | 1.0 μm | 1.0 | 49.94Ω | −0.18 db | 0.90 |
| 2 | 1.0 μm | 1.0 μm | 2.0 μm | 2.0 | 50.00Ω | −0.10 db | 0.85 |
| 3 | 1.0 μm | 1.0 μm | 2.4 μm | 2.4 | 50.47Ω | −0.08 db | — |
| 4 | 1.0 μm | 1.0 μm | 3.0 μm | 3.0 | 49.97Ω | −0.07 db | 0.75 |
| 5 | 1.0 μm | 1.0 μm | 3.5 μm | 3.5 | 50.28Ω | −0.06 db | — |
| 6 | 1.0 μm | 1.0 μm | 3.6 μm | 3.6 | 50.51Ω | −0.06 db | — |

TABLE 1-continued

| Division | Line Width (w) | Interval (s) | Thickness (t) | Aspect ratio (AR) | Characteristic impedance (Z0) | Signal Loss [@3.2 Ghz] | Expected yield (Y) |
|---|---|---|---|---|---|---|---|
| 7 | 1.0 μm | 1.0 μm | 4.0 μm | 4.0 | 49.84Ω | −0.06 db | 0.30 |

Furthermore, the second wiring layer 130 may have a thickness greater than that of each of the first and third wiring layers 120 and 140. For example, when a thickness of the first wiring layer 120 is defined as t1 and a thickness of the second wiring layer 130 is defined as t2, in consideration of a process dispersion of ±300, t1 and t2 may satisfy (2.1*t1)≤t2≤(3.9*t1). Furthermore, when the thickness of the third wiring layer 140 is defined as t3, in consideration of the process dispersion of ±300, t1 and the t3 may satisfy (2.1*t3)≤t2≤(3.9*t3). In this case, the entire thickness may be easily controlled while reducing signal loss by increasing the thickness of the wiring layer including the microcircuit. When t2 is less than 2.1 times t1 and/or t3, the thickness of the wiring layer including the microcircuit may not be sufficient to improve signal characteristics, and when t2 is more than 3.9 times t1 and/or t3, there may be a problem in yield due to process defects or the like, and there may be difficulty in controlling the thickness.

For example, as shown in Table 2 below, Inventive Example 9 satisfying the above-described conditions had an excellent effect of reducing signal loss as compared to Inventive Example 8 not satisfying the above-described conditions. Furthermore, in the case of Inventive Example 10, it may be seen that the expected yield was reduced. Meanwhile, the thickness of the wiring layer was measured using a scanning microscope, an electron microscope, and/or an optical microscope based on a polished or cut-out section of the printed circuit board. When the thickness of the wiring layer was not constant, the thickness value of the corresponding wiring layer was measured using an average value of values measured at any of five points. Furthermore, copper (Cu) was used as a material for the pattern.

TABLE 2

| Division | t1 | t2 | t3 | Signal Loss [@3.2 Ghz] | Expected Yield (Y) |
|---|---|---|---|---|---|
| 8 | 1.0 μm | 2.0 μm | 1.0 μm | −0.10 db | 0.85 |
| 9 | 1.0 μm | 3.0 μm | 1.0 μm | −0.07 db | 0.75 |
| 10 | 1.0 μm | 4.0 μm | 1.0 μm | −0.06 db | 0.30 |

Furthermore, the thickness of the second wiring layer 130 may be greater than an insulating distance between the first and second wiring layers 120 and 130 and an insulating distance between the second and third wiring layers 130 and 140, respectively. For example, when the thickness of the second wiring layer 130 is defined as t2 and the insulating distance between the first and second wiring layers 120 and 130 is defined as d1, in consideration of the process dispersion of ±30%, t2 and d1 may satisfy (1.4*d1)≤t2≤(2.6*d1). Furthermore, when the insulating distance between the second and third wiring layers 130 and 140 is defined as d2, in consideration of the process dispersion of +30%, t2 and d2 may satisfy (1.4*d2)≤t2≤(2.6*d2). In this case, the entire thickness may be easily controlled while reducing signal loss by increasing the thickness of the wiring layer including the microcircuit. When t2 is less than 1.4 times d1 and/or d2, this may not be enough to improve the signal characteristics, and when t2 is more than 2.6 times d1 and/or d2, there may be problems in yield due to process defects and the like, and there may be difficulties in controlling the thickness.

For example, as shown in Table 3 below, it may be seen that Inventive Example 12 satisfying the above-described conditions had an excellent effect of reducing signal loss as compared to Inventive Examples 11 and 13 not satisfying the above-described conditions. Furthermore, in the case of Experimental Example 13, it may be seen that the expected yield was reduced. Meanwhile, the thickness of the wiring layer and the insulating distance between the wiring layers were measured using a scanning microscope, an electron microscope, and/or an optical microscope based on a polished or cut-out section of the printed circuit board. When the thickness of the wiring layer was not constant, the thickness of the corresponding wiring layer and the insulating distance value between the wiring layers were measured using an average value of values measured at any of five points. Furthermore, copper (Cu) was used as a material for the pattern.

In one embodiment, the insulating distance between the first and second wiring layers 120 and 130 and the insulating distance between the second and third wiring layers 130 and 140 may be substantially same as each other. One or ordinary skill in the art would understand that the expression "substantially same" refers to being the same (lying on the same plane) by allowing process errors, positional deviations, and/or measurement errors that may occur in a manufacturing process, and the range thereof may be widely accepted in the art (for example, 5%, but not limited thereto).

TABLE 3

| Division | t2 | d1 | d2 | Signal Loss [@3.2 Ghz] | Expected Yield (Y) |
|---|---|---|---|---|---|
| 11 | 3.0 μm | 3.0 μm | 3.0 μm | −0.12 db | 0.85 |
| 12 | 3.0 μm | 1.5 μm | 1.5 μm | −0.07 db | 0.75 |
| 13 | 3.0 μm | 0.5 μm | 0.5 μm | −0.12 db | 0.20 |

Meanwhile, a printed circuit board 100A according to an example embodiment may be used independently, or may be attached to or embedded in another substrate.

Hereinafter, components of the printed circuit board 100A according to an example embodiment will be described in more detail with reference to the drawings.

The insulating layer 110 may include an insulating material. The insulating material may include a thermosetting resin such as an epoxy resin, a thermoplastic resin such as polyimide, or materials including inorganic fillers, organic fillers and/or glass fibers (Glass Fiber, Glass Cloth or Glass Fabric) along with these resins. For example, the insulating material may be a non-photosensitive insulating material such as an Ajinomoto Build-up Film (ABF) or prepreg (PPG), but the present disclosure is not limited thereto, and in addition thereto, other polymer materials may be used as the insulating material. Furthermore, the insulating material may be a photosensitive insulating material such as a photoimageable dielectric (PID). The insulating layer 110 may have a multilayer structure, and an interlayer boundary thereof may or may not exist.

Each of the first to third wiring layers 120, 130 and 140 may include a metallic material. The metallic material may include copper (Cu), aluminum (Al), silver (Ag), tin (Sn), gold (Au), nickel (Ni), lead (Pb), titanium (Ti), and/or alloys thereof. The metallic material may include, preferably, copper (Cu), but the present disclosure is not limited thereto. Each of the first to third wiring layers 120, 130 and 140 may perform various functions according to the design. For example, each of the first to third wiring layers 120, 130 and 140 may include a signal pattern, a power pattern, and a ground pattern. Each of these patterns may have various shapes such as a line, a plane, and a pad. Each of the first to third wiring layers 120, 130 and 140 may include an electroless plating layer (or chemical copper) and an electrolytic plating layer (or electric copper). Alternatively, each of the first to third wiring layers 120, 130 and 140 may include a metal foil (or copper foil) and an electrolytic plating layer (or electric copper). Alternatively, each of the first to third wiring layers 120, 130 and 140 may include a metal foil (or copper foil), an electroless plating layer (or chemical copper), and an electrolytic plating layer (or electric copper). The first to third wiring layers 120, 130 and 140 may include a sputtering layer instead of an electroless plating layer (or chemical copper), or may include both the sputtering layer and the electroless plating layer (or chemical copper), if necessary. If necessary, the first to third wiring layers 120, 130 and 140 may be electrically connected to each other through one or more connection vias penetrating through at least a portion of the insulating layer 110, respectively.

Figure 4:
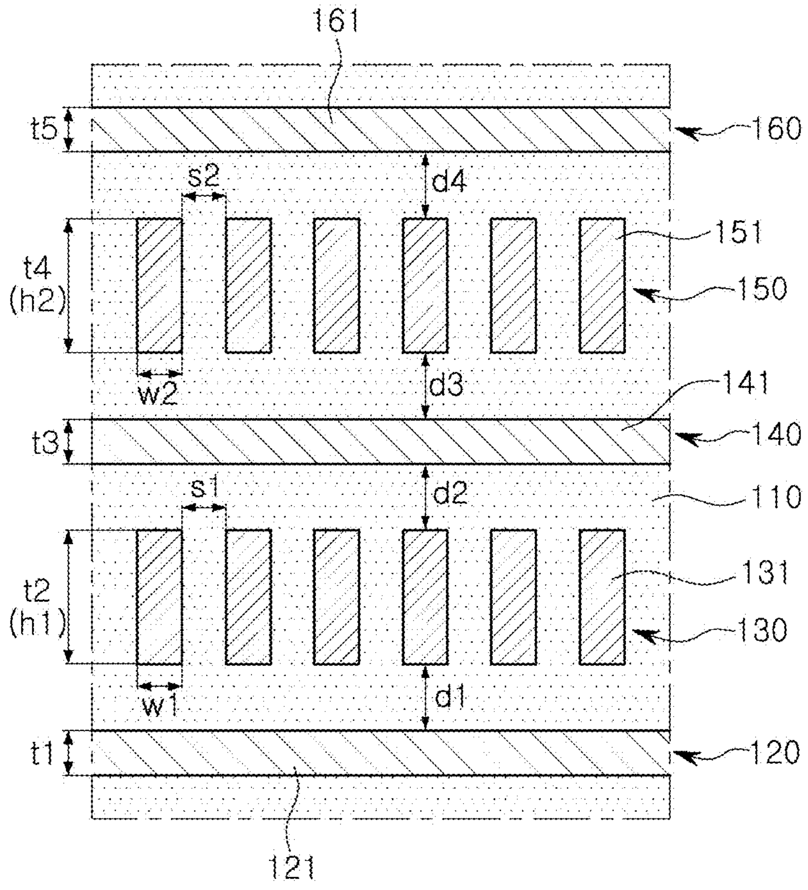
FIG. 4 is a cross-sectional view schematically illustrating another example of a printed circuit board.

FIG. 4 is a cross-sectional view schematically illustrating another example of a printed circuit board.

Referring to FIG. 4, a printed circuit board 100B according to another example embodiment may further include a fourth wiring layer 150 disposed on a third wiring layer 140, and a fifth wiring layer 160 disposed on a fourth wiring layer 150, among a plurality of wiring layers 120, 130, 140, 150 and 160, in the printed circuit board 100A according to the aforementioned example embodiment. The fourth wiring layer 150 may include a microcircuit pattern 151, for example, a signal pattern, and the third and fifth wiring layers 140 and 160 may include ground patterns 141 and 161, respectively.

Meanwhile, each of the second and fourth wiring layers 130 and 150 may include one or more microcircuit patterns 131 and 151 and have an aspect ratio, which is a ratio of a height to a line width, being 2.4 to 3.6. For example, each of the microcircuit patterns 131 and 151 may have a line width (w1 and w2) of substantially 1 μm, an interval (s1 and s2) between the patterns of substantially 1 μm, and a height (h1 and h2) of substantially 3 μm, but the present disclosure is not limited thereto. In this case, signal loss may be reduced by increasing a cross-sectional area while maintaining the signal pattern as the microcircuit pattern, thereby improving signal characteristics, and details thereof are as described above.

Furthermore, the fourth wiring layer 150 may have a thickness greater than that of each of the third and fifth wiring layers 140 and 160. For example, when a thickness of the third wiring layer 140 is defined as t3 and a thickness of the fourth wiring layer 150 is defined as t4, in consideration of the process dispersion of ±30%, the t3 and the t4 may satisfy $(2.1*t3) \leq t4 \leq (3.9*t3)$. Furthermore, when a thickness of the fifth wiring layer 160 is defined as t5, in consideration of the process dispersion of ±30%, the t4 and the t5 may satisfy $(2.1*t5) \leq t4 \leq (3.9*t5)$. In this case, an entire thickness may be easily controlled while reducing signal loss by increasing the thickness of the wiring layer including the microcircuit, and details thereof are as described above.

Furthermore, the thickness of the fourth wiring layer 150 may be greater than an insulating distance between the third and fourth wiring layers 140 and 150 and an insulating distance between the fourth and fifth wiring layers 150 and 160, respectively. For example, when the thickness of the fourth wiring layer 150 is defined as t4 and the insulating distance between the third and fourth wiring layers 140 and 150 is defined as d3, in consideration of the process dispersion of ±30%, the t4 and the d3 may satisfy $(1.4*d3) \leq t4 \leq (2.6*d3)$. Furthermore, when the insulating distance between the fourth and fifth wiring layers 150 and 160 is defined as d4, in consideration of the process dispersion of +30%, the t4 and the d4 may satisfy $(1.4*d4) \leq t4 \leq (2.6*d4)$. In this case, an entire thickness may be easily controlled while reducing signal loss by increasing the thickness of the wiring layer including the microcircuit, and details thereof are as described above.

Hereinafter, components of the printed circuit board 100B according to another example embodiment will be described in more detail with reference to the drawings.

Each of the fourth and fifth wiring layers 150 and 160 may include a metallic material. The metallic material may include copper (Cu), aluminum (Al), silver (Ag), tin (Sn), gold (Au), nickel (Ni), lead (Pb), titanium (Ti), and/or alloys thereof. Each of the fourth and fifth wiring layers 150 and 160 may include, preferably, copper (Cu), but the present disclosure is not limited thereto. Each of the fourth and fifth wiring layers 150 and 160 may perform various functions according to the design. For example, each of the fourth and fifth wiring layers 150 and 160 may include a signal pattern, a power pattern, and a ground pattern. Each of these patterns may have various shapes such as a line, a plane, and a pad. Each of the fourth and fifth wiring layers 150 and 160 may include an electroless plating layer (or chemical copper) and an electrolytic plating layer (or electric copper). Alternatively, each of the fourth and fifth wiring layers 150 and 160 may include a metal foil (or copper foil) and an electrolytic plating layer (or electric copper). Alternatively, each of the fourth and fifth wiring layers 150 and 160 may include a metal foil (or copper foil), an electroless plating layer (or chemical copper), and an electrolytic plating layer (or electric copper). Each of the fourth and fifth wiring layers 150 and 160 may include a sputtering layer instead of an electroless plating layer (or chemical copper), or may include both the sputtering layer and the electroless plating layer (or chemical copper) if necessary. If necessary, the first to fifth wiring layers 120, 130, 140, 150 and 160 may be electrically connected to each other through one or more connection vias respectively penetrating through at least a portion of the insulating layer 110.

Other contents are substantially the same as those described in the printed circuit board 100A according to the above-described example embodiment, and thus overlapping descriptions thereof will be omitted.

Figure 5:
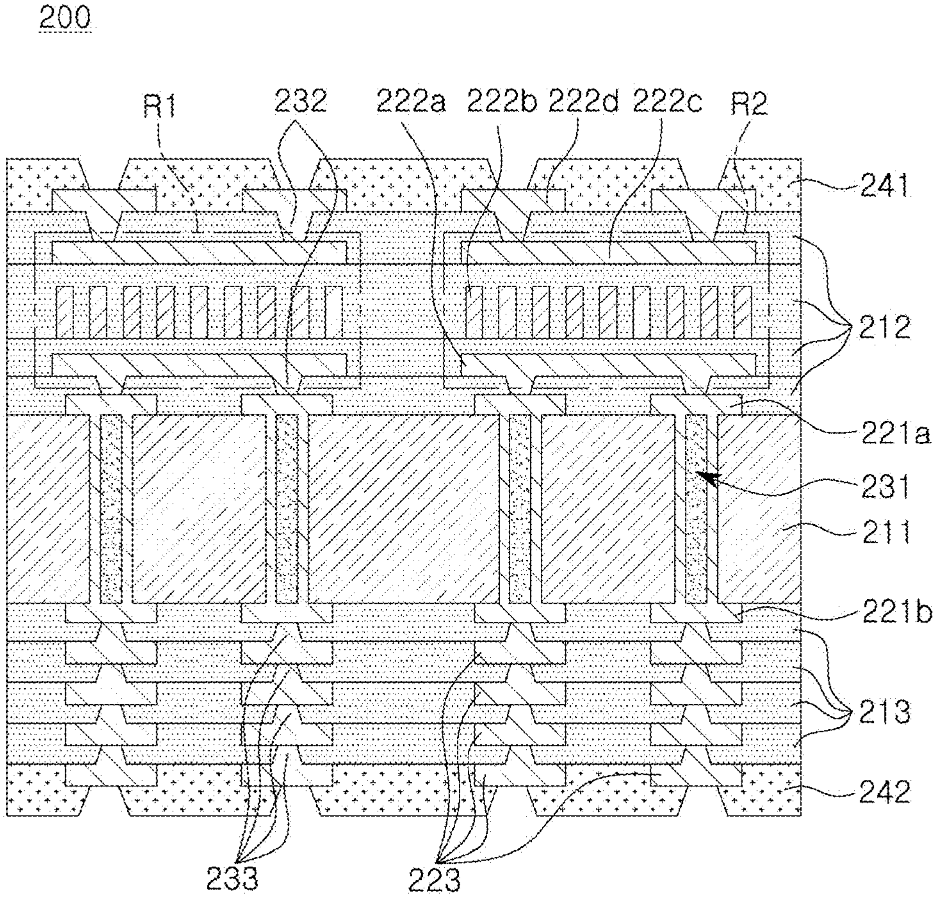
FIG. 5 is a schematic cross-sectional view of another example of a printed circuit board.

FIG. 5 is a schematic cross-sectional view of another example of a printed circuit board.

Referring to FIG. 5, a printed circuit board 200 according to another example embodiment may include a core layer 211, first and second core wiring layers 221*a* and 221*b* respectively disposed on upper and lower surfaces of the core layer 211, a through-via 231 penetrating through the core layer 211 and connecting the first and second core wiring layers 221_a_ and 221_b_ to each other, a plurality of first build-up insulating layers 212 disposed on the upper surface of the core layer 211, a plurality of first build-up wiring layers 222_a_, 222_b_, 222_c_ and 222_d_ disposed on or in a plurality of first build-up insulating layers 212, respectively, a plurality of first build-up via layers 232 respectively penetrating through at least one of the plurality of first build-up insulating layers 212 and respectively connected to at least one of a plurality of first build-up wiring layers 222_a_, 222_b_, 222_c_ and 222_d_, a plurality of second build-up insulating layers 213 disposed on the lower surface of the core layer 211, a plurality of second build-up wiring layers 223 respectively disposed on or in the plurality of second build-up insulating layers 213, and a plurality of second build-up via layers 233 respectively penetrating through at least one of the plurality of second build-up insulating layers 213 and respectively connected to at least one of the plurality of second build-up wiring layers 223, respectively. If necessary, the printed circuit board 200 may further include a first resist layer disposed on the plurality of first build-up insulating layers 212 and/or a second resist layer 242 disposed on the plurality of second build-up insulating layers 213.

Meanwhile, the plurality of first build-up insulating layers 212 may include the insulating layer 110 of the printed circuit board 100A according to the above-described example embodiment or the insulating layer 110 of the printed circuit board 100B according to another example embodiment described above. Furthermore, the plurality of first build-up wiring layers 222_a_, 222_b_, 222_c_ and 222_d_ may include the plurality of wiring layers 120, 130 and 140 of the printed circuit board 100A according to the above-described example embodiment or the plurality of wiring layers 120, 130, 140, 150 and 160 of the printed circuit board 100B according to another example described above. For example, a printed circuit board 200 according to another example embodiment may have a first region R1 and/or a second region R2 to which the printed circuit board 100A according to the above-described example embodiment or the printed circuit board 100B according to another example embodiment may applied. For example, the printed circuit board 200 according to another example embodiment may be a package substrate, and may have the above-described microcircuit layer in the first region R1 and/or the second region R2.

On the other hand, if necessary, the printed circuit board 100 according to the above-described example embodiment or the printed circuit board 100B according to another example embodiment described above may be embedded in the printed circuit board 200 according to another example embodiment in the form of a separate microcircuit board in the first region R1 and/or the second region R2. For example, after forming a cavity in the plurality of first build-up insulating layers 212 of the printed circuit board 200 according to another example embodiment, the printed circuit board 100 according to the above-described example embodiment or the printed circuit board 100B according to another example embodiment described above may be inserted into the cavity and embedded therein. For example, the printed circuit board 100 according to the above-described example embodiment or the printed circuit board 100B according to another example embodiment described above may function as an organic bridge for an interconnect.

Hereinafter, components of the printed circuit board 200 according to another example embodiment will be described in more detail with reference to the drawings.

The core layer 211 may include an insulating material. A thermosetting resin such as an epoxy resin, a thermoplastic resin such as polyimide, or a material in which these insulating resins are mixed with inorganic fillers such as silica, or a resin impregnated into a core material such as glass fiber (Glass Fiber, Glass Cloth or Glass Fabric) with the inorganic fillers, for example, a copper clad laminate (CCL), may be used as the insulating material, but the present disclosure is not limited thereto. The core layer 211 may have a thickness greater than that of each of a plurality of first and second build-up insulating layers 212 and 213, but the present disclosure is not limited thereto.

Each of the plurality of first and second build-up insulating layers 212 and 213 may include an insulating material. A thermosetting resin such as an epoxy resin, a thermoplastic resin such as polyimide, or a material in which these insulating resins are mixed with inorganic fillers such as silica, or a resin impregnated into a core material such as glass fiber with the inorganic fillers, for example, an Ajinomoto Build-up Film (ABF), a Prepreg, a resin coated copper (RCC) and a photoimageable dielectric (PID), may be used as the insulating material, but the present disclosure is not limited thereto. The number of layers of the plurality of first and second build-up insulating layers 212 and 213 may be the same, but the present disclosure is not limited thereto.

Each of the first and second core wiring layers 221_a_ and 221_b_ may include a metal. Copper (Cu), aluminum (Al), silver (Ag), tin (Sn), gold (Au), nickel (Ni), lead (Pb), titanium (Ti), or alloys thereof may be used as the metal, and the metal may include, preferably, copper (Cu), but the present disclosure is not limited thereto. The first and second core wiring layers 221_a_ and 221_b_ may include an electroless plating layer (or chemical copper) and an electrolytic plating layer (or electric copper), respectively, but the present disclosure is not limited thereto. The first and second core wiring layers 221_a_ and 221_b_ may form a sputtering layer instead of an electroless plating layer, or may include both the sputtering layer and the electroless plating layer. Additionally, the first and second core wiring layers 221_a_ and 221_b_ may further include a copper foil. Each of the first and second core wiring layers 221_a_ and 221_b_ may perform various functions according to the design of the corresponding layer. For example, each of the first and second core wiring layers 221_a_ and 221_b_ may include a ground pattern, a power pattern, and a signal pattern. Each of these patterns may include a line pattern, a plane pattern, and/or a pad pattern.

Each of a plurality of first and second build-up wiring layers 222_a_, 222_b_, 222_c_, 222_d_ and 223 may include a metal. Copper (Cu), aluminum (Al), silver (Ag), tin (Sn), gold (Au), nickel (Ni), lead (Pb), titanium (Ti), or alloys thereof may be used as the metal, and the metal may include, preferably, copper (Cu), but the present disclosure is not limited thereto. Each of the plurality of first and second build-up wiring layers 222_a_, 222_b_, 222_c_, 222_d_ and 223 may include an electroless plating layer (or chemical copper) and an electrolytic plating layer (or electric copper), but the present disclosure is not limited thereto. Each of the plurality of first and second build-up wiring layers 222_a_, 222_b_, 222_c_, 222_d_ and 223 may form a sputtering layer instead of an electroless plating layer, or may include both the sputtering layer and the electroless plating layer. Additionally, each of the plurality of first and second build-up wiring layers 222_a_, 222_b_, 222_c_, 222_d_ and 223 may further include a copper foil. Each of the plurality of first and second build-up wiring layers 222_a_, 222_b_, 222_c_, 222_d_ and 223 may perform various functions according to the design of the corresponding layer. For example, each of the plurality of first and second build-up wiring layers 222_a_, 222_b_, 222_c_, 222_d_ and 223 may include a ground pattern, a power pattern, and a signal pattern. Each of these patterns may include a line pattern, a plane pattern, and/or a pad pattern.

The through-via 231 may include a metal layer formed on a wall surface of a through-hole and a plug filling the metal layer. The metal layer may include copper (Cu), aluminum (Al), silver (Ag), tin (Sn), gold (Au), nickel (Ni), lead (Pb), titanium (Ti), or alloys thereof, and the metal layer may include, preferably copper (Cu), but the present disclosure is not limited thereto. The plug may include an ink of an insulating material. The metal layer may include an electroless plating layer (or chemical copper) and an electrolytic plating layer (or electric copper), but the present disclosure is not limited thereto. The metal layer may form a sputtering layer instead of an electroless plating layer, or may include both the sputtering layer and the electroless plating layer. The through-via 231 may perform various functions according to the design. For example, the through-via 231 may include a ground via, a power via, and a signal via.

A plurality of first and second build-up via layers 232 and 233 may include a micro via. The micro via may be a field via filling the via hole or a conformal via disposed along a wall surface of the via hole. The micro via may be disposed in a stacked type and/or a staggered type. Each of the plurality of first and second build-up via layers 232 and 233 may include a metal, and the metal may include copper (Cu), aluminum (Al), silver (Ag), tin (Sn), gold (Au), nickel (Ni), lead (Pb), titanium (Ti), or alloys thereof, and may include, preferably, copper (Cu), but the present disclosure is not limited thereto. Each of the plurality of first and second build-up via layers 232 and 233 may include an electroless plating layer (or chemical copper) and an electrolytic plating layer (or electric copper), but the present disclosure is not limited thereto. Each of the plurality of first and second build-up via layers 232 and 233 may form a sputtering layer instead of an electroless plating layer, or may include both the sputtering layer and the electroless plating layer. The plurality of first and second build-up via layers 232 and 233 may perform various functions according to the design of the corresponding layer. For example, the plurality of first and second build-up via layers 232 and 233 may include a ground via, a power via, and a signal via.

First and second resist layers 241 and 242 may include a liquid or film type solder resist, but the present disclosure is not limited thereto, and other types of insulating materials may be used. The first resist layer 241 may have an opening exposing at least a portion of a first build-up wiring layer **222*d* in an uppermost side. The second resist layer 242 may have an opening exposing at least a portion of a second build-up wiring layer 223** in a lowermost side.

Other contents are substantially the same as those described in the printed circuit boards 100A and 100B according to the above-described example embodiment and another example embodiment, and thus overlapping descriptions thereof will be omitted.

Figure 6:
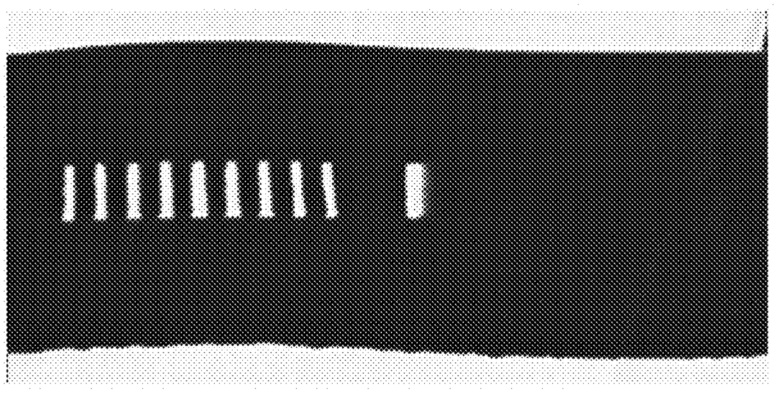
FIG. 6 is a cross-sectional view schematically illustrating an image of a wiring layer including a microcircuit.

FIG. 6 is a cross-sectional view schematically illustrating an image of a wiring layer including a microcircuit.

Referring to FIG. 6, the microcircuit according to the present disclosure may have a line/space of about 1 μm/1 μm, and may have a thickness or a height of about 3 μm. For example, an aspect ratio may be about 3. In this case, since the microcircuit may increase a cross-sectional area, excellent signal characteristics may be obtained by reducing signal loss. Meanwhile, a cross-sectional image of the wiring layer may be obtained using a known scanning microscope, an electron microscope, and/or an optical microscope.

In the present disclosure, substantially, determination may be performed by including a process error or a positional deviation occurring in a manufacturing process, and an error during measurement. For example, the fact that a line width, a gap, a thickness and a height have substantially specific values may include not only having a corresponding value, but also having a value similar thereto.

In the present disclosure, the same insulating material may mean not only a case of being completely the same insulating material, but also including the same type of insulating material. Thus, a composition of the insulating material may be substantially the same, but specific composition ratios thereof may be slightly different.

In the present disclosure, the meaning on the cross-section may refer to a cross-sectional shape when an object is cut vertically, or a cross-sectional shape when the object is viewed in a side-view. Furthermore, the meaning on a plane may refer to a planar shape when the object is horizontally cut, or a planar shape when the object is viewed in a top-view or a bottom-view.

In the present disclosure, a lower side, a lower portion, and a lower surface are used to refer to a downward direction with respect to a cross-section of a drawing, and an upper side, an upper portion, and an upper surface are used to refer to an opposite direction thereof. However, this defines the direction for convenience of explanation, and the scope of the rights of the claims is not particularly limited by the description of such a direction, and the concept of upper and lower portions may be changed at any time.

In the present disclosure, a meaning of being connected is a concept including not only directly connected but also indirectly connected through an adhesive layer or the like. Furthermore, a meaning of electrically connected is a concept including both physically connected and not connected. In addition, expressions such as first and second are used to distinguish one component from another, and do not limit the order and/or importance of the components. In some cases, a first component may be referred to as a second component without departing from the scope of rights, or similarly, the second component may be referred to as the first component.

The expression 'example embodiment used in the present disclosure' does not mean the same embodiment, and is provided to explain different unique characteristics. However, the example embodiments presented above do not preclude being implemented in combination with features of other example embodiments. For example, even if matters described in a particular example embodiment are not described in other example embodiments, they may be understood as explanations related to other example embodiments unless there is an explanation contrary to or contradictory to matters in other example embodiments.

The terms used in the present disclosure are used only to describe an example embodiment and are not intended to limit the present disclosure. In this case, singular expressions include plural expressions unless they are clearly meant differently in the context.

What is claimed is:

1. A printed circuit board, comprising:

an insulating layer; and a plurality of wiring layers disposed in the insulating layer, wherein the plurality of wiring layers comprise a first wiring layer, a second wiring layer disposed on the first wiring layer, and a third wiring layer disposed on the second wiring layer, the second wiring layer is thicker than each of the first and third wiring layers, and the second wiring layer comprises one or microcircuit patterns and has an aspect ratio, which is a ratio of a height to a line width, being 2.4 to 3.6.

2. The printed circuit board according to claim 1, wherein each of the first and third wiring layers comprises a ground pattern, and the microcircuit pattern of the second wiring layer is a signal pattern.

3. The printed circuit board according to claim 1, wherein the microcircuit pattern of the second wiring layer has a line width of substantially 1 μm, an interval between adjacent patterns, among the one or microcircuit patterns, of substantially 1 μm, and a height of substantially 3 μm.

4. The printed circuit board according to claim 1, wherein, when a thickness of the first wiring layer is defined as t1 and a thickness of the second wiring layer is defined as t2, t1 and t2 satisfy $(2.1*t1) \leq t2 \leq (3.9*t1)$.

5. The printed circuit board according to claim 4, wherein, when a thickness of the first wiring layer is defined as t1 and a thickness of the third wiring layer is defined as t3, t1 and the t3 satisfy $(2.1*t3) \leq t2 \leq (3.9*t3)$.

6. The printed circuit board according to claim 1, wherein a thickness of the second wiring layer is greater than each of an insulating distance between the first and second wiring layers and an insulating distance between the second and third wiring layers.

7. The printed circuit board according to claim 6, wherein, when a thickness of the second wiring layer is defined as t2 and an insulation distance between the first and second wiring layers is defined as d1, t2 and d1 satisfy $(1.4*d1) \leq t2 \leq (2.6*d1)$.

8. The printed circuit board according to claim 7, wherein, when a thickness of the second wiring layer is defined as t2 and an insulation distance between the second and third wiring layers is defined as d2, t2 and d2 satisfy $(1.4*d2) \leq t2 \leq (2.6*d2)$.

9. The printed circuit board according to claim 8, wherein the insulating distance between the first and second wiring layers and the insulating distance between the second and third wiring layers are substantially same as each other.

10. The printed circuit board according to claim 1, wherein the plurality of wiring layers further comprise a fourth wiring layer disposed on the third wiring layer and a fifth wiring layer disposed on the fourth wiring layer, and the fourth wiring layer is thicker than each of the third and fifth wiring layers.

11. The printed circuit board according to claim 10, wherein a thickness of the fourth wiring layer is greater than each of an insulating distance between the third and fourth wiring layers and an insulating distance between the fourth and fifth wiring layers.

12. The printed circuit board according to claim 1, further comprising a plurality of build-up insulating layers, a plurality of build-up wiring layers, and a plurality of build-up via layers, the plurality of build-up insulating layers includes the insulating layer, and the plurality of build-up wiring layers includes the plurality of wiring layers.

13. The printed circuit board according to claim 12, further comprising a core layer, first and second core wiring layers respectively disposed on upper and lower surfaces of the core layer, a through-via penetrating through the core layer and connecting the first and second core wiring layers to each other.

14. The printed circuit board according to claim 13, wherein:

the plurality of build-up insulating layers includes a plurality of first build-up insulating layers disposed on the upper surface of the core layer, and a plurality of second build-up insulating layers disposed on the lower surface of the core layer, the plurality of build-up wiring layers includes a plurality of first build-up wiring layers respectively disposed on or in the plurality of first build-up insulating layers, and a plurality of second build-up wiring layers respectively disposed on or in the plurality of second build-up insulating layers, and the plurality of build-up via layers includes a plurality of first build-up via layers respectively penetrating through at least one of the plurality of first build-up insulating layers and respectively connected to at least one of the plurality of first build-up wiring layers, and a plurality of second build-up via layers respectively penetrating through at least one of the plurality of second build-up insulating layers and respectively connected to at least one of the plurality of second build-up wiring layers.

15. A printed circuit board, comprising:

an insulating layer; and a plurality of wiring layers disposed in the insulating layer, wherein the plurality of wiring layers comprise a first wiring layer, a second wiring layer disposed on the first wiring layer, and a third wiring layer disposed on the second wiring layer, the second wiring layer is thicker than each of the first and third wiring layers, a thickness of the second wiring layer is greater than each of an insulating distance between the first and second wiring layers and an insulating distance between the second and third wiring layers, and when the thickness of the second wiring layer is defined as t2, the insulating distance between the first and second wiring layers is defined as d1, and the insulating distance between the second and third wiring layers is defined as d2, t2, d1 and d2 satisfy $(1.4*d1) \leq t2 \leq (2.6*d1)$ and $(1.4*d2) \leq t2 \leq (2.6*d2)$.

16. The printed circuit board according to claim 15, wherein, when thicknesses of the first and third wiring layers are defined as t1 and t3, respectively, t1, t2 and the t3 satisfy $(2.1*t1) \leq t2 \leq (3.9*t1)$ and $(2.1*t3)$ $t2 \leq (3.9*t3)$.

17. The printed circuit board according to claim 15, wherein each of the first and third wiring layers comprises one or more ground patterns, and the second wiring layer comprises one or more signal patterns.

18. The printed circuit board according to claim 17, wherein the signal pattern has a line width of substantially 1 μm, an interval between adjacent patterns, among the one or microcircuit patterns, of substantially 1 μm, and a height of substantially 3 μm.

* * * * *